United States Patent

Rugg

[15] 3,667,009

[45] May 30, 1972

[54] COMPLEMENTARY METAL OXIDE SEMICONDUCTOR GATE PROTECTION DIODE

[72] Inventor: James M. Rugg, Tempe, Ariz.

[73] Assignee: Motorola, Inc., Franklin Park, Ill.

[22] Filed: Dec. 28, 1970

[21] Appl. No.: 101,885

[52] U.S. Cl. ....................317/235, 29/576

[51] Int. Cl. ....................H01l 11/14

[58] Field of Search ....................317/234, 235

[56] References Cited

UNITED STATES PATENTS

| | | | |
|---|---|---|---|
| 3,244,949 | 4/1966 | Hilbiber | 317/235 |
| 3,450,961 | 6/1969 | Tsai | 317/235 |
| 3,453,498 | 7/1969 | Hubner | 317/101 |
| 3,551,760 | 12/1970 | Tokuyama | 317/235 |

*Primary Examiner*—James D. Kallam
*Attorney*—Mueller & Aichele

[57] ABSTRACT

Gate protection is given to a complementary metal oxide semiconductor (CMOS) devices against excessive input voltage transients. An input diode which has a lower breakdown voltage than the gate oxide is attached to the input terminal to protect the gate oxide. The input protect diode is formed by diffusing an N+ region which overlaps both a P tube and an N substrate. The diffusion concentrations between the various regions determine the breakdown voltage of the protection diode. The overlapping relationship of the N+ diffusion over the P− tub and N substrate creates a structure which prevents parasitic NPN action.

11 Claims, 8 Drawing Figures

INVENTOR
James M. Rugg

BY Mueller & Aichele

ATTY'S.

INVENTOR
James M. Rugg
BY
Mueller & Aichele
ATTY'S.

COMPLEMENTARY METAL OXIDE SEMICONDUCTOR GATE PROTECTION DIODE

BACKGROUND OF THE INVENTION

A well known problem experienced by MOS devices, is the build up of static charge between the gate oxide and the silicon semiconductor body. The build up of charge between the gate oxide and the semiconductor body reaches a breakdown condition at the point when the electric field ruptures the gate oxide layer and discharges current into the semiconductor body. This discharge is a destructive discharge and ruptures the gate oxide rendering the MOS device unusable. The most commonly used gate dielectric material is silicon dioxide which ruptures when the electric field across it reaches approximately 6–10 × $10^6$ volts/cm. For typical MOS structures this means the oxide will rupture for voltages greater than 70 to 90 volts. When other gate dielectrics are used, such as silicon nitride, aluminum oxide, or combination of these with $SiO_2$, the gate rupture voltage may increase but the fundamental problem is still present.

The most common technique employed to prevent the rupturing of the gate oxide is putting a PN diode from the input to ground such that upon the application of an excess voltage level to the input terminal, the diode breaks down first and the excess voltage discharges through the diode to ground. Since the diode is designed for this function, it can experience repeated breakdowns without damaging its own structure. In this manner, the gate oxide is continuously protected from excess voltage applied to any input terminal.

A second variation of the diode connected between the input terminal and ground is classified as a field enhancement breakdown diode. Such a device is a back biased diode, as previously mentioned, in combination with a metal plate over the junction between the P and N type conductivity materials. This metal plate reduces the voltage at which the diode breaks down. This lowering of the breakdown voltage renders greater protection to the device since the lower the breakdown voltage the more protection for the gate oxide layer.

A third version of the diode protect scheme for MOS input terminals is a punch through diode which consists of a pair of spaced diffusions of one conductivity type located within an opposite conductivity type region. Basically, such a structure is still a reversed biased or back biased diode but the depletion layer around the diode, which is a charge layer, spreads as the voltage is increased on the diode. It spreads until the depletion layer from one diffused region merges with the depletion layer from the second diffused region and at that point the structure carries current between the two regions and it discharges the input terminal or voltage node that such device is protecting. Additionally, this punch through diode has the advantage that it can be made to break down at lower voltages than a straight back biased diode mentioned in the first example above. The spacings of the two conductivity areas determines the breakdown voltage expected from this device. Accordingly, its operation is limited by the spacing tolerances which can be maintained for the process technology employed in its manufacture.

The three examples described hereinabove are usable in protecting an input terminal from excess charge build up. The function of the diodes is to discharge the current building up at the input node through a device designed for repeated breakdown and steering this current away from the gate oxide. However, all three devices suffer from a common ailment in that they break down at a small region right near the surface and all the current is carried by that small region. The current limited to the small region gives the breakdown path a high series resistance to ground. This high series resistance to ground increases the time to breakdown period or commonly referred to as the reaction time. Additionally, the high series resistance effectively raises the breakdown voltage of the diode and resistor in series. More specifically the breakdown device is no longer considered as a diode alone but a resistor in series with the diode.

In a complementary metal oxide semiconductor (CMOS) structure it is customary to locate a diode diffusion within a tub of a first conductivity material which tub in turn is located in a substrate of opposite conductivity type material. The diode diffusion is also of opposite conductivity type material. Accordingly, between the conductivity type of the diode diffusion, the tub conductivity and the substrate conductivity a bipolar transistor action can occur. For example, a P tub within an N substrate having a diode diffusion of N type conductivity in the P tub would result in an NPN transistor structure. The substrate being the collector, the tub being the base, and the diode diffusion of N type conductivity being the emitter. This configuration is looked upon as a vertical bipolar transistor within a CMOS structure. As is well known, whenever the base of an NPN transistor becomes positively biased with respect to its emitter, then the transistor is turned on and current flows from emitter to collector.

The vertical transistor located in the CMOS structure has two different modes of operation depending upon whether the vertical transistor has its emitter connected to an input terminal or if the emitter is connected internal to the MOS circuit where the source of heavy current is unavailable. If the emitter is connected to an internal portion of the MOS structure no heavy current drain is available and the vertical transistor does not tend to draw excessive current. However, when the emitter is connected to a terminal which contacts the outside world, excessive current can be drawn therefrom such as to cause considerable damage to the structure. Since the current flow obtainable from such vertical transistors lies within the range of hundreds of milliamps, the CMOS structure does not attain its design requirement of having low power drain. Additionally, the turning on of such a vertical transistor can destroy the CMOS structure due to excessive heating and subsequent burn-out.

SUMMARY OF THE INVENTION

The present invention relates to input protect mechanisms for MOS transistors, and more particularly, relates to input protect devices relating to CMOS structures for protecting against gate oxide destruction and input transient effects.

It is an object of the present invention to provide an improved gate oxide protect mechanism for use with a CMOS structure.

It is a further object of the present invention to provide a gate protect diode having an easily predictable and controllable breakdown voltage.

It is a still further object of the present invention to provide a gate protection diode for use with a CMOS structure without generating a vertical bipolar transistor.

It is still a further object of the present invention to provide a gate protect diode for a CMOS structure while avoiding parasitic transistor action between the diode and other regions of the CMOS structure for generating or drawing unwanted currents.

These and other objects and features of this invention will become fully apparent in the following description of the accompanying drawings, wherein:

FIG. 3 shows the formation of apertures in the surface oxide;

FIG. 4 shows the formation of P type conductivity tubs;

FIG. 5 shows the formation of the cathode of the protection diode at the same time as the formation of the source-drain regions of an N channel MOS transistor;

FIG. 6 shows the formation of an enhancement region for contacting the anode of the protection diode at the same time as the formation of the source-drain regions of a P channel MOS transistor;

FIG. 7 shows the formation of gate regions for the CMOS transistors and the contact for the enhancement region; and FIG. 8 shows a second embodiment of the present invention as also shown in FIG. 2, wherein a pair of individual enhancement contacts are formed in the diode device and the portion of the diode body separating such contacts form a current limiting resistor.

BRIEF SUMMARY OF THE INVENTION

Using P+, N+ and P— diffusions, a low voltage breakdown diode is disclosed having improved operating characteristics. The surface concentration of the P— region is varied in order to adjust the diode breakdown voltage. The surface concentration is reduced for increasing the breakdown voltage and the surface concentration is increased to reduce the diode breakdown voltage. The N+ diffusion is formed partially within the P— diffusion and partially within the substrate portion of the semiconductor device. This effective overlying portion of the P— diffusion eliminates a vertical bipolar transistor within the MOS device. A P+ region is formed in the P— region for improving the contact to the P— region. In a separate embodiment of the present invention a plurality of spaced P+ diffusions are formed in the P— REGION. One such region forms an input lead to the breakdown diode structure and at least a second contact provides an output lead connection to the diode breakdown device. In this manner, the series resistance of the P— region limits the amount of current any input connection can draw of external the circuit.

DETAILED DESCRIPTION OF THE DRAWINGS

The same numerals are used throughout the description and the several views to identify the same subject matter. Although, an N+ diffusion within an earlier P— diffusion is shown for fabricating the diode of the present invention, a P+ diffusion within an earlier N diffusion could be used. Additionally, etching out the various areas and refilling during an epitaxial deposition could be employed as well as forming the various regions by diffusions.

Figure 1:
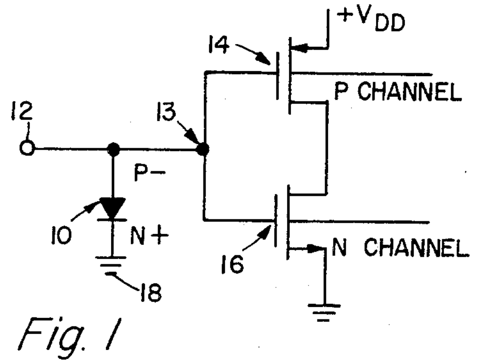
FIG. 1 shows a schematic view of a first embodiment of the present invention.

Referring to FIG. 1, there can be seen a schematic view of the improved CMOS gate protection diode. A gate protection diode 10 is shown connected between an input terminal 12 and a junction point 13 of the gate electrodes of a P channel CMOS device 14 and an N channel CMOS device 16. The cathode of the gate protection diode 12 is connected to ground 18 and the anode of the gate protection diode 10 is connected to the input terminal 12 and the junction 13 of the gate electrodes of the P channel MOS device 14 and the N channel MOS device 16.

Figure 2:
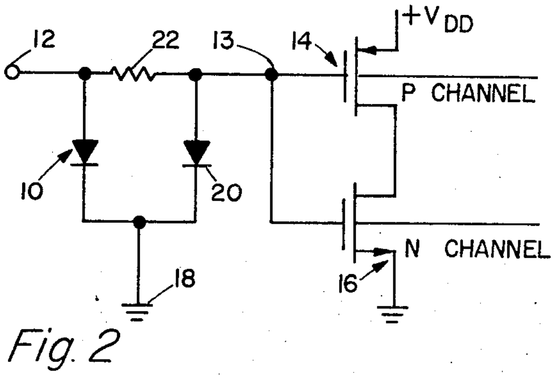
FIG. 2 shows a schematic view of a second embodiment of the present invention.

Referring to FIG. 2, there can be seen a second embodiment of the present invention which includes all the elements of the device of the circuit shown in FIG. 1 with the addition of a second gate protection diode 20 and a resistor 22 added in series between the input terminal 12 and the junction 13. The resistor 22 has a first end, and a second end and each of the diodes 10 and 22 are connected to opposite ends of the input resistor. The resistor 22 operates to limit the current which can be drawn from the input terminal 12 for application to the junction 13.

Figure 3:
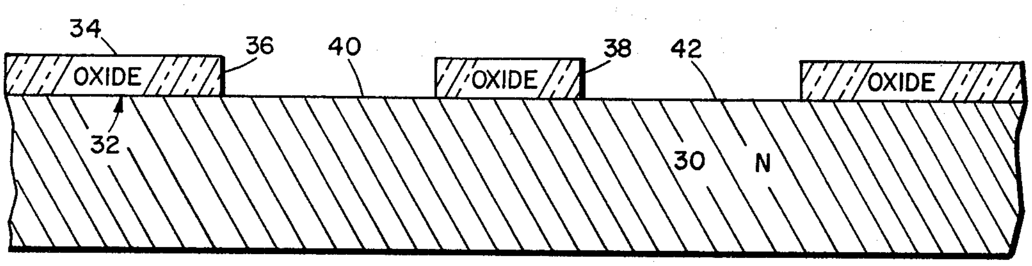
FIGS. 3 through 8 show the processing steps employed in fabricating devices containing the present invention.

Referring to FIG. 3, there is shown a semiconductor substrate 30. The body of semiconductor material 30 selected is silicon and is of the conductivity type identified as N type semiconductor material having a resistivity between 1 ohm centimeter to 10 ohms centimeters. Although the starting material is specified as silicon and the resistivity is given with a specific range, the conductivity type could easily be P type conductivity and the resistivity range can be extended to those well known in the prior art. These two features form no restriction or limitation on the present invention.

The body of semiconductor material 30 is formed with an upper surface 32 upon which a layer of oxide or silicon nitride 34 is formed having a plurality of apertures 36 and 38. These are formed exposing respective portions 40 and 42 of the upper surface 32 of the semiconductor body 30.

Figure 4:
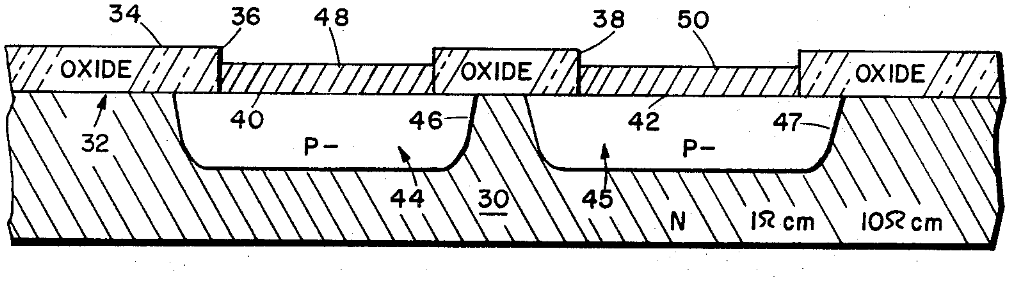

Referring to FIG. 4, there is shown the formation of a plurality of P— regions 44 and 45, within the N type substrate 30 and forming PN junctions 46 and 47 with the substrate 30, respectively. The P— tubs 44 and 45 are formed by the diffusion of conductivity type determining impurity such as boron into the substrate 30. Conveniently, the diffusions 44 and 46 extend typically 10 microns into the substrate 30. An operable range lies between the limits of 5 to 20 microns. The surface concentration of the conductivity type determining impurity lies within the range of $5 \times 10^{15}$ atoms/cc to $3 \times 10^{16}$ atoms/cc. During the diffusion of the boron into the substrate 30, oxide regions 48 and 50 regrow over the surface portions 40 and 42 respectively, through which the diffusion occurred.

Figure 5:
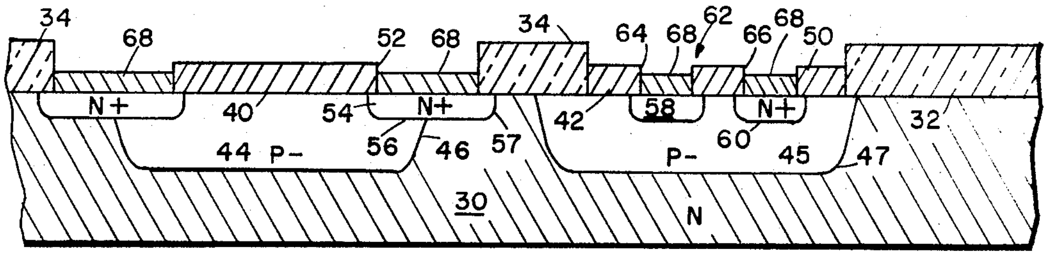

Referring to FIG. 5, there is shown the opening of an additional aperture 52 for exposing the junction 46 at the line at which it intersects the surface 32. In the figure shown, the junction 46 is shown lying substantially in the center of the aperture 52 such that the diffusion described hereinafter lies equally on both sides of the junction 46. This equalization of the diffusion is not required as a considerable amount of offset is permitted and the device functions satisfactorily. An N+ diffusion is performed through the aperture 52 by passing conductivity type determining impurities through the aperture 52 such as to form an N+ region 54. The N+ region 54 extends across the junction 46 so as to form a PN junction 56 and a continuation of this junction is an N+N impurity gradient junction 57. The diode breakdown which performs the gate protection action occurs at the junction 56. Simultaneously with the formation of the N+ region 54 the source and drain regions 58 and 60 of the N channel MOS device 62 are formed through additional apertures 64 and 66 formed within the oxide layer 50. Within the aperture 52 used in forming the region 56 and the apertures 64 and 66 used in forming the source and drain regions of the N channel MOS device, an additional oxide layer 68 is uniformly grown covering the diffusions just previously taking place.

Figure 6:
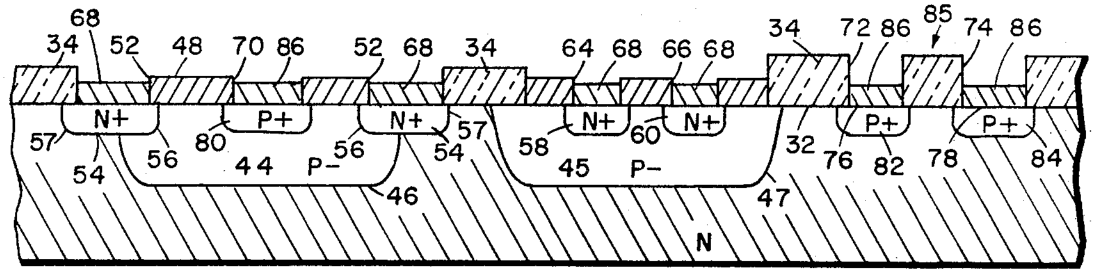

Referring to FIG. 6, there is shown the next process step used in forming the gate protection diode for the CMOS structure. An aperture 70 is formed in the oxide layer 48 overlying the P— region 44. A pair of apertures 72 and 74 are formed within the oxide layer 34 exposing additional surface regions 76 and 78 of the surface 32. Conductivity type determining impurities are diffused into the exposed surfaces of the substrate body forming a plurality of P+ regions 80, 82 and 84 respectively. The region 80 operates as an enhancement contact region to the P— region 44. The regions 82 and 84 operate as source and drain regions of a P channel MOS device 85. The impurity diffusion for the region 80 is identical to that for the source and drain regions 82 and 84. An oxide layer 86 regrows over the enhancement region 80, and the source and drain regions 82 and 84.

Figure 7:
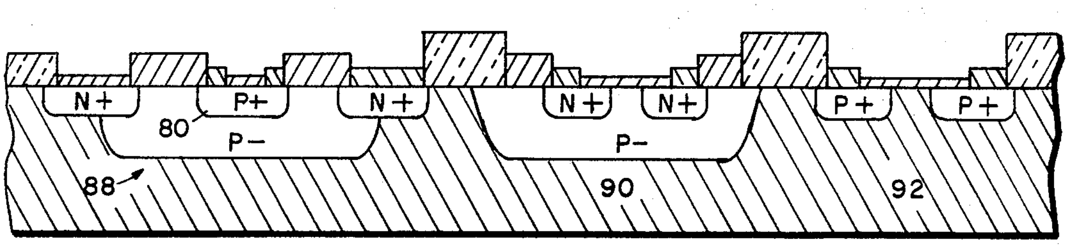

Referring to FIG. 7, there is shown a CMOS structure including a gate protection diode shown generally at 88, an N channel MOS device shown at 90 and a P channel device shown at 92. The device shown in FIG. 7 is completed by opening the contacts to the P+ region 80 in the input protection diode 88 and the source gate and drain regions of the N channel and P channel devices 90 and 92. A layer of metal is deposited over the entire surface of the MOS structure and excess metal is etched away except at those points at which it is desired to make contact to the protection diode, N channel device and P channel device. Amorphous silicon can be employed equally as well and by way of high level doping for increasing the impurity concentration, contact can be made through amorphous silicon.

Figure 8:
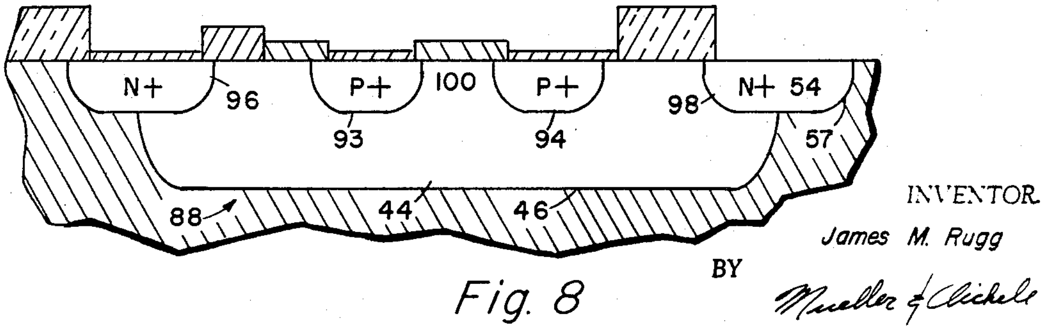

Referring to FIG. 8, there is shown the second embodiment of the present invention employing a pair of input diodes. A plurality of regions 93 and 94 are shown positioned within the P— region 44. The regions 93 and 94 form contacts to each of two diodes. The two contacts provide a pair of diodes, since a diode action exists between a point of contact to the P— area and the substrate. The diode breakdown action occurs at the junctions 96 and 98. A resistor is formed in the region indicated generally at 100 and operates to limit the current drawn from the input terminal 12 as shown with reference to FIG. 2. The resistor 22, shown in FIG. 2, is formed in the region indicated generally as 100 and comprises the resistivity of the P– material forming the region 44.

Referring again to FIG. 5, the gate protection occurs by a breaking down of the junction 56 shown intersecting the junction 46. The doping level of the P– region 44 determines the breakdown voltage value occurring at the junction 56. The P region 44 conveniently lies within an impurity concentration range of between $5 \times 10^{15}$ atoms per cc to $3 \times 10^{16}$ atoms per cc. The N+ region is much less critical. It can be doped to a much higher level extending from anything greater than $10^{18}$ atoms per cc up to $5 \times 10^{20}$ atoms per cc. The criticality of the N+ doping region 54 is less critical because the lightly doped side of the junction 56 in the P– region 44 determines the junction breakdown. As far as the diode structure is concerned, the depth of the P region 44 lying within the substrate body 30 is insignificant. This is quite different from bipolar technology where the depth of the region is quite critical. This follows the general understanding of current flow in MOS devices insofar as such devices depend on lateral current flow and lateral dimensions as opposed to vertical dimensions. The same surface concentration in a P region, such as 44, determines the breakdown voltage of the input diode irrespective of the depth of the P region. In those situations having a shallower P region the sheet resistance would change but the surface concentration would remain the same.

In order to regulate the value of voltage at which the input diode breaks down, it is necessary to change the surface concentration of the impurities lying in the P region 44. In order to increase the breakdown voltage it is necessary to reduce the surface concentration. In order to reduce the voltage level of the breakdown voltage it is necessary to increase the surface concentration of the impurities lying in the P region 44. The N+ diffusion 54 is shown annular in form overlying the PN junction 45. The shape of the N+ region 54 is shown for convenience only and can assume any geometric shape convenient to the layout of the CMOS device. Additionally, it need not be a continuous region but may be discontinuous in form.

Referring again generally to FIGS. 2 and 8, the second embodiment employing a resistor in series with the input terminal 12 and the gate junction 13 is described. The terminal 12, in an integrated circuit packaging arrangement, is connected to a terminal pad and as is well known, current and voltage transients are experienced at such a terminal pad. The junction 13 represents an internal junction and, in the figure shown, it is connected to the gate electrodes of the MOS devices 14 and 16. The resistor 22, accordingly, limits the current available from the bonding pad 12 to the junction 13. The value of the resistance 22 is determined by the resistance per unit square of the P– doping level shown within the region 100 of the structure shown in FIG. 8. The value of such resistor 22 is varied by varying the doping levels of the P– region 44 and/or is determined by the spacing of the two P+ regions 93 and 94. The value of the resistor 22 lies within the range of 200 ohms to 5,000 ohms. The value of such input resistance is selected from the possible ranges by circuit considerations. The value of the resistor should be kept within the above recited range so as not to effect the maximum operating frequency of the device. When this resistance becomes too large, the time constant of the input circuit increases and slows down the operating speed of the circuit.

While the invention has been particularly shown and described with reference to preferred embodiment thereof it will be understood by those skilled in the art the foregoing and other changes in form and details may be made therein without departing from the spirit and scope of the invention.

What is claimed is:

1. In combination:

a body of semiconductor material of a first conductivity type and having an upper surface;

a CMOS device comprising gate, source and drain electrodes in said body; and a voltage sensitive protecting means connectable to said gate electrode for diverting excessive signal voltage from said gate electrode, comprising;

a first region extending into said body from said upper surface and being of an opposite conductivity type and forming a first junction with said body, and a second region extending into said body from said upper surface and being of a first conductivity type and being positioned partially overlying said first region and forming a second junction with said first region and an interface with said body; and said second region having a first impurity concentration and said first region having an impurity surface concentration less than said second region for establishing a voltage value above which current flows between said first and second regions.

2. A voltage sensitive protecting means as recited in claim 1, and further comprising;

a third region of higher conductivity than said first region and of said same conductivity type and being positioned within said first region for forming a contact enhancement region.

3. A voltage sensitive protecting means as recited in claim 2, and further comprising;

means including said third region for connecting said gate electrode to said second region upon current flowing from said second region, through said first region and into said body for diverting excessive signal voltage from said gate electrode.

4. A voltage sensitive protecting means as recited in claim 1, and further comprising:

a pair of spaced third regions of higher conductivity than said first region and being of said same conductivity type and being positioned within said first region for forming contact enhancement regions; and said portion of said semiconductor body positioned between said third regions forming a current limiting resistor.

5. A voltage sensitive protecting means as recited in claim 4, and further comprising:

first means including one of said third regions connected to said gate electrode; and second means including another of said third regions for receiving input signal.

6. A CMOS device including a voltage sensitive protecting means, comprising:

a body of semiconductor material having an upper surface and being of a first conductivity type and relatively high resistivity for forming a first structure of MOS device;

a plurality of spaced first regions of opposite conductivity type material extending into said body from said surface and each of said first regions forming a first junction with said body and said first regions being of relatively high resistivity for forming a second structure of MOS device;

a plurality of second regions extending into said body from said upper surface and being of a first conductivity type and relatively low resistivity;

a first one of said second regions being positioned partially overlying a first one of said first regions and forming a second junction with said first region and an interface with said body;

additional ones of said second regions being positioned in a second one of said first regions as a source and drain region of said second MOS device;

a plurality of third regions extending into said body from said upper surface and being of an opposite conductivity type and relatively low resistivity;

at least a first one of said third regions being positioned within said first one of said first regions for providing a contact enhancement region for said first one of said first regions;

additional ones of said third regions being positioned in said body as a source and drain region of said first MOS device;
gate electrodes adhering to said upper surface and positioned between said source and drain regions of said first MOS device and said second MOS device;
means for establishing a reference potential at said first one of said second regions; and
connecting means interconnecting said first of said third regions and said gate electrodes.

7. A CMOS device as recited in claim 6, wherein:
said first of said second regions is annular shaped and terminates said junction between said corresponding first region and said body.

8. A CMOS device as recited in claim 6, wherein:
said first MOS device is a P-channel MOS device; and
said second MOS device is an N-channel MOS device.

9. A CMOS device as recited in claim 6, wherein:
said third region positioned in said first one of said first regions having a first impurity concentration and said first one of said first regions having an impurity surface concentration less than said last mentioned third region for establishing a voltage value above which current flows between said last mentioned first and third regions respectively.

10. A CMOS device as recited in claim 6, wherein:
said semiconductor body having a resistivity lying within the range of 1 ohm centimeter to 10 ohms centimeter.

11. The method of fabricating a CMOS semiconductor device comprising the steps of:
providing a semiconductor body having an upper surface and being of one type, relatively high resistivity material and being suitable for the formation of a first type MOS device;
forming a plurality of spaced first regions of opposite conductivity extending into said body from said surface and each of said first regions forming a first junction with said body and said first regions being of relatively high resistivity type material and being suitable for the formation of a second type MOS device;
establishing a source and drain region of a second type MOS device within a first of said first regions and simultaneously establishing within a second of said first regions a second region comparable to said source and drain regions and said second region being positioned partially overlying said second one of said first regions and forming a second junction with said first region and an interface with said body;
establishing a source and drain region of a first type MOS device within said body and simultaneously establishing within said second of said first regions a third region comparable to said source and drain regions of said first type MOS device for operating as a contact enhancement region for said second of said first regions;
forming gate electrodes for said first type MOS device and for said second type MOS device; and
forming a metallization layer on said upper surface including at least a conductive path between said gate electrodes and said second region.

* * * * *